US010939594B2

(12) United States Patent
Long et al.

(10) Patent No.: US 10,939,594 B2
(45) Date of Patent: Mar. 2, 2021

(54) GASKET FOR RECEPTACLE CAGE (71) Applicant: TE CONNECTIVITY CORPORATION, Berwyn, PA (US)

(72) Inventors: Richard James Long, Columbia, PA (US); Alex Michael Sharf, Harrisburg, PA (US); Steven David Dunwoody, Middletown, PA (US)

(73) Assignee: TE CONNECTIVITY CORPORATION, Berwyn, PA (US)

(*) Notice: Subject to any disclaimer, the term of this patent is extended or adjusted under 35 U.S.C. 154(b) by 0 days.

(21) Appl. No.: 16/413,996

(22) Filed: May 16, 2019

(65) Prior Publication Data
US 2020/0367392 A1 Nov. 19, 2020

(51) Int. Cl.
*H05K 9/00* (2006.01)
*H01R 13/6582* (2011.01)
*H01R 13/74* (2006.01)
*G02B 6/42* (2006.01)
*H05K 5/02* (2006.01)

(52) U.S. Cl.
CPC ......... *H05K 9/0016* (2013.01); *G02B 6/4277* (2013.01); *H01R 13/6582* (2013.01); *H01R 13/745* (2013.01); *H05K 5/0217* (2013.01); *H05K 9/0009* (2013.01); *H05K 9/0032* (2013.01); *H05K 9/0081* (2013.01)

(58) Field of Classification Search
CPC .. H05K 9/0016; H05K 9/0081; H05K 9/0015; H05K 5/0217; H05K 5/032; H05K 5/0009; H01R 13/745; H01R 13/6582; G02B 6/4277
See application file for complete search history.

(56) References Cited

U.S. PATENT DOCUMENTS

| | | | |
|---|---|---|---|
| 6,304,436 B1 | 10/2001 | Branch et al. | |
| 6,478,622 B1 * | 11/2002 | Hwang | H05K 9/0058 439/607.2 |
| 7,219,404 B2 * | 5/2007 | Haga | H01R 13/741 24/458 |
| 7,438,596 B2 * | 10/2008 | Phillips | H01R 13/6582 439/607.01 |
| 7,591,680 B2 * | 9/2009 | Zhang | H01R 13/6582 439/607.38 |
| 7,597,590 B2 * | 10/2009 | McColloch | G02B 6/4201 439/607.18 |
| 7,727,018 B2 * | 6/2010 | Bright | H01R 13/741 439/607.28 |
| 7,857,662 B2 * | 12/2010 | Gillespie | H01R 13/65802 439/607.3 |

(Continued)

*Primary Examiner* — Briggitte R. Hammond (57) ABSTRACT

A receptacle cage includes cage walls extending between a front end and a rear end including a top wall and side walls forming a module channel receiving a pluggable module. The receptacle cage includes a gasket at the front end having EMI springs electrically connected to the cage walls. Each EMI spring has a deflectable portion between a base and a distal end. The distal end is split with a first end beam and a second end beam at the distal end separated by a gap. The deflectable portion is spaced apart from the cage wall and is deflectable toward the cage wall. Each EMI spring has first and second side edges between the base and the distal end. The EMI springs are arranged side-by-side without gaps between adjacent EMI springs.

19 Claims, 4 Drawing Sheets

(56) References Cited

U.S. PATENT DOCUMENTS

| | | | | |
|---|---|---|---|---|
| 7,928,324 B2* | 4/2011 | Moore | ............... | G02B 6/4246 |
| | | | | 174/354 |
| 8,064,207 B2* | 11/2011 | Wu | ................. | G06K 13/08 |
| | | | | 361/726 |
| 8,251,746 B2* | 8/2012 | Zhang | ............... | H01R 13/6581 |
| | | | | 439/607.11 |
| 8,444,437 B2* | 5/2013 | Szczesny | ........... | H01R 13/6587 |
| | | | | 361/704 |
| 8,550,848 B2* | 10/2013 | Wu | ................... | H01R 13/6583 |
| | | | | 439/353 |
| 8,599,559 B1* | 12/2013 | Morrison | ............ | H05K 9/0058 |
| | | | | 361/702 |
| 8,636,544 B1* | 1/2014 | Briant | ................. | H01R 13/658 |
| | | | | 439/607.25 |
| 8,668,515 B2* | 3/2014 | Wu | ...................... | H01R 13/633 |
| | | | | 439/352 |
| 8,890,004 B2* | 11/2014 | Wickes | ............... | H05K 9/0009 |
| | | | | 174/354 |
| 9,325,100 B2* | 4/2016 | Hirschy | ................. | H01R 13/46 |
| 9,413,115 B1* | 8/2016 | Henry | ................. | H05K 9/0016 |
| 9,525,223 B2 | 12/2016 | Little et al. | | |
| 9,532,490 B2* | 12/2016 | Bandhu | ............... | H05K 9/0016 |
| 9,831,613 B2* | 11/2017 | Liu | ................... | H01R 13/6583 |
| 10,104,760 B1 | 10/2018 | Briant et al. | | |
| 10,104,793 B2 | 10/2018 | Briant et al. | | |
| 2010/0266246 A1* | 10/2010 | van Haaster | ......... | G02B 6/4201 |
| | | | | 385/94 |
| 2012/0058670 A1* | 3/2012 | Regnier | ............ | H01R 13/6586 |
| | | | | 439/485 |
| 2014/0196943 A1* | 7/2014 | Hirschy | .............. | G02B 6/4277 |
| | | | | 174/382 |
| 2019/0363494 A1* | 11/2019 | Sharf | ................ | H01R 13/6594 |

* cited by examiner

GASKET FOR RECEPTACLE CAGE

BACKGROUND OF THE INVENTION

The subject matter herein relates generally to receptacle cages.

Some communication systems utilize receptacle assemblies having communication connectors to interconnect various components of the system for data communication. The receptacle assemblies include receptacle cages that receive pluggable modules, such as I/O modules, that are electrically connected to the communication connector. The receptacle cages provide electrical shielding, such as EMI shielding, for the pluggable modules. The receptacle cages are typically arranged at an interface of another component, such as through an opening in a panel or bezel. Conventional receptacle cages have gaskets at the interface with the panel to electrically connect the receptacle cage to the panel. However, conventional communication systems have performance problems, particularly when transmitting at high data rates. For instance, gaskets of known communication systems are leakage areas for EMI.

A need remains for a receptacle cage having improved electrical shielding.

BRIEF DESCRIPTION OF THE INVENTION

In one embodiment, a receptacle cage is provided including cage walls including a top wall, a first side wall extending from the top wall, and a second side wall extending from the top wall opposite the first side wall. The top wall, the first side wall, and the second side wall form a module channel that is configured to receive a pluggable module. The cage walls extend between a front end and a rear end of the receptacle cage. The module channel receives the pluggable module at the front end. The receptacle cage includes a gasket at the front end. The gasket has EMI springs that are electrically connected to the cage walls. Each EMI spring has a base and a distal end opposite the base with a deflectable portion between the base and the distal end. The base is provided at the corresponding cage wall. The distal end engages the corresponding cage wall. The distal end is split with a first end beam and a second end beam at the distal end separated by a gap. The deflectable portion is spaced apart from the cage wall and is deflectable toward the cage wall. Each EMI spring has a first side edge between the base and the distal end and a second side edge between the base and the distal end. The EMI springs are arranged side-by-side without a gap between adjacent EMI springs.

Optionally, the first side edge may engage the second side edge of the adjacent EMI spring and the second side edge may engage the first side edge of the adjacent EMI spring. The EMI springs may be split from each other and may be independently movable. The spacing between adjacent EMI springs may be less than the thickness of the EMI springs. The gasket may be laser cut to separate and form the EMI springs.

Optionally, the deflectable portion may include a panel interface that may be configured to engage a panel. The EMI springs may be arranged side-by-side without gaps between the bases and the panel interfaces. The deflectable portion may include a panel interface configured to engage a panel. The EMI springs may be arranged side-by-side without gaps between the distal ends and the panel interfaces.

Optionally, the gasket may include a first gasket member and a second gasket member. The first gasket member may include a first subset of the EMI springs that may be connected by a first carrier strip. The second gasket member may include a second subset of the EMI springs that may be connected by a second carrier strip. The first and second gasket members may be coupled together such that the first and second subsets of the EMI springs may be internested.

Optionally, the slot may extend along the deflectable portion. The first and second end beams may be independently deflectable. The first end beam may have a first point of contact with the corresponding cage wall. The second end beam may have a second point of contact with the corresponding cage wall. The first and second points of contact may be offset from a center line of the EMI spring toward the first and second side edges, respectively. The first point of contact may be in close proximity to the second point of contact of the adjacent EMI spring and the second point of contact may be in close proximity to the first point of contact of the adjacent EMI spring.

Optionally, the first end beam may include a first foot flared outward away from the slot toward the adjacent EMI spring and the second end beam includes a second foot flared outward away from the slot toward the adjacent EMI spring.

Optionally, the gasket may be integral with the cage walls. The gasket may extend along the top wall, the first side wall, and/or the second side wall. The EMI spring may extend along an exterior surface of the corresponding cage wall to engage a panel. The EMI spring may extend along an interior surface of the corresponding cage wall to engage the pluggable module.

In another embodiment, a receptacle cage is provided. The receptacle cage includes cage walls including a top wall, a first side wall extending from the top wall, and a second side wall extending from the top wall opposite the first side wall. The top wall, the first side wall, and the second side wall form a module channel that is configured to receive a pluggable module. The cage walls extend between a front end and a rear end of the receptacle cage. The module channel is received the pluggable module at the front end. The receptacle cage includes a gasket at the front end. The gasket has EMI springs electrically connected to the cage walls. Each EMI spring has a base and a distal end opposite the base with a deflectable portion between the base and the distal end. The base is provided at the corresponding cage wall. The distal end engages the corresponding cage wall. The deflectable portion is spaced apart from the cage wall and is deflectable toward the cage wall. Each EMI spring has a first side edge between the base and the distal end and a second side edge between the base and the distal end. The EMI springs are arranged side-by-side with first side edges facing second side edges of adjacent EMI springs without gaps between the first and second side edges.

In a further embodiment, a receptacle cage is provided. The receptacle cage includes cage walls including a top wall, a first side wall extending from the top wall, and a second side wall extending from the top wall opposite the first side wall. The top wall, the first side wall, and the second side wall form a module channel that is configured to receive a pluggable module. The cage walls extend between a front end and a rear end of the receptacle cage. The module channel receives the pluggable module at the front end. The receptacle cage includes a gasket at the front end. The gasket has EMI springs electrically connected to the cage walls. Each EMI spring has a base and a distal end opposite the base with a deflectable portion between the base and the distal end. The base is provided at the corresponding cage wall. The distal end engages the corresponding cage wall. The distal end is split with a first end beam and a second end beam at the distal end separated by a gap. The deflectable portion is spaced apart from the cage wall and is deflectable toward the cage wall. Each EMI spring has a first side edge between the base and the distal end and a second side edge between the base and the distal end.

DETAILED DESCRIPTION OF THE INVENTION

Figure 1:
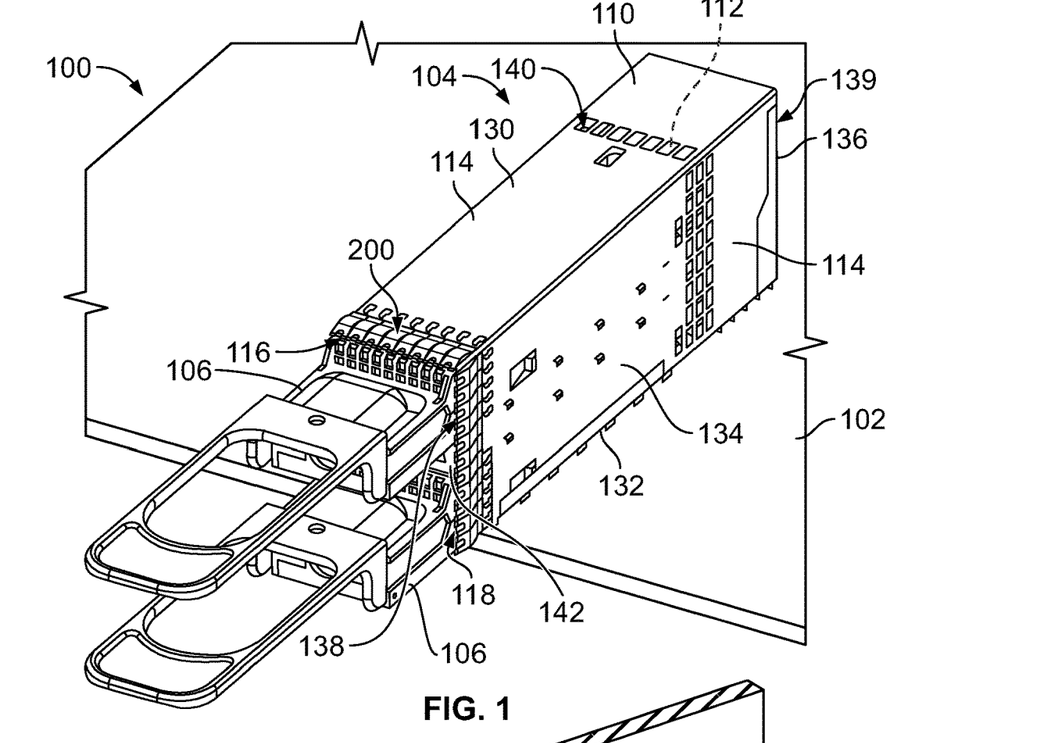
FIG. 1 is a front perspective view of a communication system including a receptacle cage formed in accordance with an exemplary embodiment.
Figure 2:
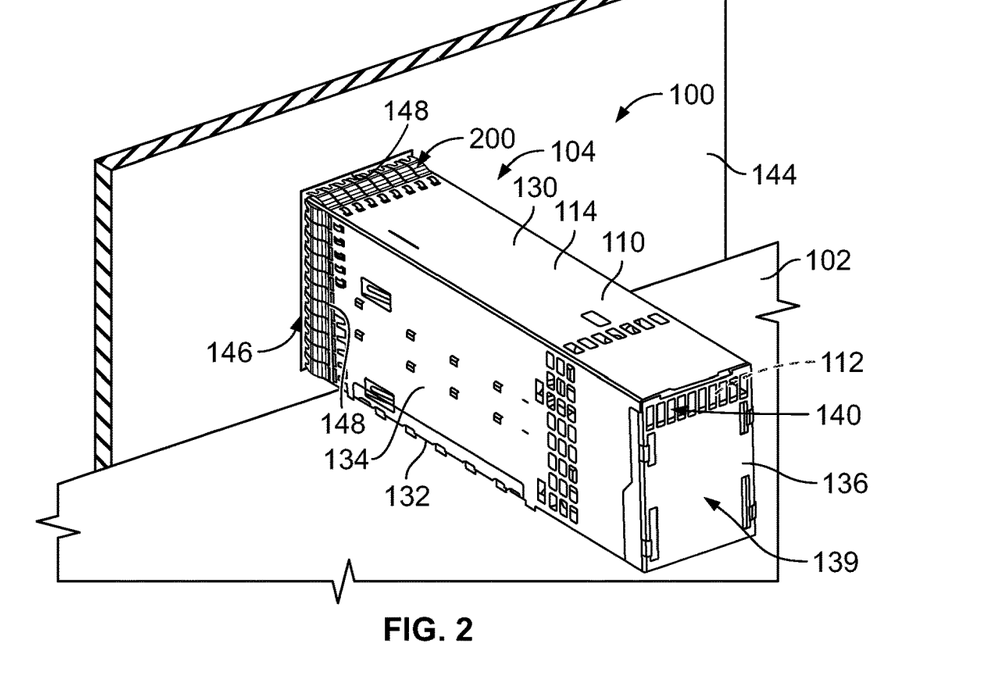
FIG. 2 is a rear perspective view of the communication system formed in accordance with an exemplary embodiment.

FIG. 1 is a front perspective view of a communication system 100 formed in accordance with an exemplary embodiment. FIG. 2 is a rear perspective view of the communication system 100 formed in accordance with an exemplary embodiment. The communication system 100 includes a circuit board 102 and a receptacle connector assembly 104 mounted to the circuit board 102. Pluggable modules 106 are configured to be electrically connected to the receptacle connector assembly 104. The pluggable modules 106 are electrically connected to the circuit board 102 through the receptacle connector assembly 104.

In an exemplary embodiment, the receptacle connector assembly 104 includes a receptacle cage 110 and a communication connector 112 (shown in phantom) adjacent the receptacle cage 110. For example, in the illustrated embodiment, the communication connector 112 is received in the receptacle cage 110. In other various embodiments, the communication connector 112 may be located rearward of the receptacle cage 110. In various embodiments, the receptacle cage 110 is enclosed and provides electrical shielding for the communication connector 112. The pluggable modules 106 are loaded into the receptacle cage 110 and are at least partially surrounded by the receptacle cage 110. The receptacle cage 110 includes a plurality of cage walls 114 that define one or more module channels for receipt of corresponding pluggable modules 106. The cage walls 114 may be walls defined by solid sheets, perforated walls to allow airflow therethrough, walls with cutouts, such as for a heatsink or heat spreader to pass therethrough, or walls defined by rails or beams with relatively large openings, such as for airflow therethrough. In an exemplary embodiment, the receptacle cage 110 is a shielding, stamped and formed cage member with the cage walls 114 being shielding walls.

In the illustrated embodiment, the receptacle cage 110 constitutes a stacked cage member having an upper module channel 116 and a lower module channel 118. The receptacle connector assembly 104 is configured to mate with the pluggable modules 106 in both stacked module channels 116, 118. The receptacle cage 110 has module ports that open to the module channels 116, 118 that receive the pluggable modules 106. Any number of module channels may be provided in various embodiments. In the illustrated embodiment, the receptacle cage 110 includes the upper and lower module channels 116, 118 arranged in a single column; however, the receptacle cage 110 may include multiple columns of ganged module channels 116, 118 in alternative embodiments (for example, 2×2, 3×2, 4×2, 4×3, etc.). In other various embodiments, rather than being a stacked cage member, the receptacle cage 110 may be a single port or single row cage member (for example, 1×2, 1×4, etc.). Optionally, multiple communication connectors 112 may be arranged within the receptacle cage 110, such as when multiple columns of module channels 116 and/or 118 are provided.

In an exemplary embodiment, the cage walls 114 of the receptacle cage 110 include a top wall 130, a bottom wall 132, side walls 134, and a rear wall 136. The bottom wall 132 may rest on the circuit board 102. However, in alternative embodiments, the receptacle cage 110 may be provided without the bottom wall 132. The receptacle cage 110 extends between a front end 138 and a rear end 139. The module ports are provided at the front end 138 and receive the pluggable modules 106 through the front end 138. The cage walls 114 define a cavity 140. For example, the cavity 140 may be defined by the top wall 130, the bottom wall 132, the side walls 134, and the rear wall 136. Other cage walls 114 may separate or divide the cavity 140 into the various module channels 116, 118. For example, the cage walls 114 include a divider 142 between the upper and lower module channels 116, 118. The divider 142 forms a space between the upper and lower module channels 116, 118, such as for airflow, for routing light pipes, or for other purposes. In the illustrated embodiment, the divider 142 is a horizontal divider positioned between the upper and lower module channels 116, 118. In other various embodiments, the cage walls 114 may include vertical separator panels (not shown), such as parallel to the side walls 134, between ganged module channels 116 and/or 118.

In an exemplary embodiment, the receptacle cage 110 includes one or more gaskets 200 at the front end 138 for providing electrical shielding for the receptacle cage 110. The gasket 200 is configured to electrically connect with the pluggable modules 106 received in the corresponding module channels 116, 118. The gasket 200 is configured to engage a panel 144 (FIG. 2) to electrically connect the receptacle cage 110 to the panel 144. For example, the front end 138 of the receptacle cage 110 extends through a panel opening 146 in the panel 144. The gasket 200 is configured to engage panel edges 148 of the panel 144 defining the panel opening 146. The gasket 200 may be compressed within the panel opening 146 by the panel edges 148.

In an exemplary embodiment, the receptacle connector assembly 104 may include one or more heat sinks (not shown) for dissipating heat from the pluggable modules 106. For example, the heat sink may be coupled to the top wall 130 for engaging the upper pluggable module 106 received in the upper module channel 116. The heat sink may extend through an opening in the top wall 130 to directly engage the pluggable module 106. Other types of heat sinks may be provided in alternative embodiments.

In an exemplary embodiment, the receptacle connector assembly 104 may include light pipes (not shown) indicating connectivity status of the pluggable modules 106 within the communication system 100. The light pipes may pass through the divider 142 to the front end 138 of the receptacle cage 110. The light pipes may be coupled to the communication connector 112. The light pipes may receive light from LEDs (not shown) mounted to the circuit board 102 beneath or behind the communication connector 112.

In an exemplary embodiment, the communication connector 112 is received in the cavity 140, such as proximate to the rear wall 136. However, in alternative embodiments, the communication connector 112 may be located behind the rear wall 136 exterior of the receptacle cage 110 and extend into the cavity 140 to interface with the pluggable module(s) 106. For example, the rear wall 136 may include an opening to receive components therethrough. In an exemplary embodiment, a single communication connector 112 is used to electrically connect with the pair of stacked pluggable modules 106 in the upper and lower module channels 116, 118. In alternative embodiments, the communication system 100 may include discrete, stacked communication connectors 112 (for example, an upper communication connector and a lower communication connector) for mating with the corresponding pluggable modules 106.

In an exemplary embodiment, the pluggable modules 106 are loaded into the receptacle cage 110 through the front end 138 to mate with the communication connector 112. The shielding cage walls 114 of the receptacle cage 110 provide electrical shielding around the communication connector 112 and the pluggable modules 106, such as around the mating interfaces between the communication connector 112 and the pluggable modules 106. The gasket 200 may interface with the pluggable modules 106 to electrically connect the receptacle cage 110 to the pluggable modules 106 and to close any gaps between the pluggable modules 106 and the receptacle cage 110 to prevent EMI leakage through such gaps. The communication connector 112 is coupled to the circuit board 102. The receptacle cage 110 is mounted to the circuit board 102 over the communication connector 112.

Figure 3:
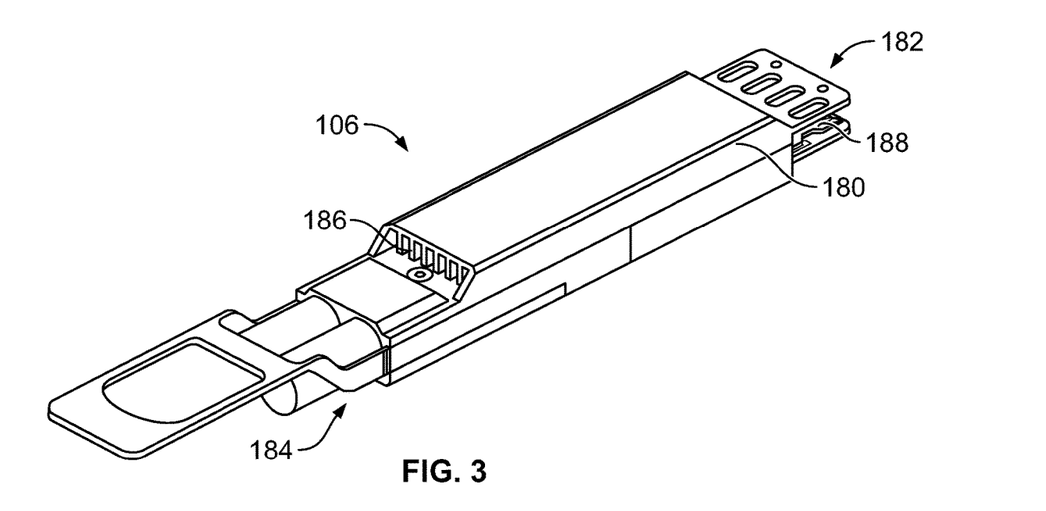
FIG. 3 is a rear perspective view of a pluggable module of the communication system in accordance with an exemplary embodiment.

FIG. 3 is a rear perspective view of the pluggable module 106 in accordance with an exemplary embodiment. The pluggable module 106 has a pluggable body 180, which may be defined by one or more shells. The pluggable body may be thermally conductive and/or may be electrically conductive, such as to provide EMI shielding for the pluggable module 106. The pluggable body 180 includes a mating end 182 and an opposite front end 184. The front end 184 may be a cable end having a cable extending therefrom to another component within the system. The mating end 182 is configured to be inserted into the corresponding module channel 116 or 118 (shown in FIG. 1). In an exemplary embodiment, exterior surface of the pluggable body 180, such as sides, the top, the bottom, may be engaged by the gasket 200 (shown in FIG. 1).

The pluggable module 106 includes a module circuit board 188 that is configured to be communicatively coupled to the communication connector 112 (shown in FIG. 1). The module circuit board 188 may be accessible at the mating end 182. The module circuit board 188 may include components, circuits and the like used for operating and/or using the pluggable module 106. For example, the module circuit board 188 may have conductors, traces, pads, electronics, sensors, controllers, switches, inputs, outputs, and the like associated with the module circuit board 188, which may be mounted to the module circuit board 188, to form various circuits.

In an exemplary embodiment, the pluggable body 180 provides heat transfer for the module circuit board 188, such as for the electronic components on the module circuit board 188. For example, the module circuit board 188 is in thermal communication with the pluggable body 180 and the pluggable body 180 transfers heat from the module circuit board 188. In an exemplary embodiment, the pluggable body 180 includes a plurality of heat transfer fins 186 along at least a portion of the pluggable module 106. The fins 186 transfer heat away from the main shell of the pluggable body 180, and thus from the module circuit board 188 and associated components. In the illustrated embodiment, the fins 186 are parallel plates that extend lengthwise; however, the fins 186 may have other shapes in alternative embodiments, such as cylindrical or other shaped posts.

Figure 4:
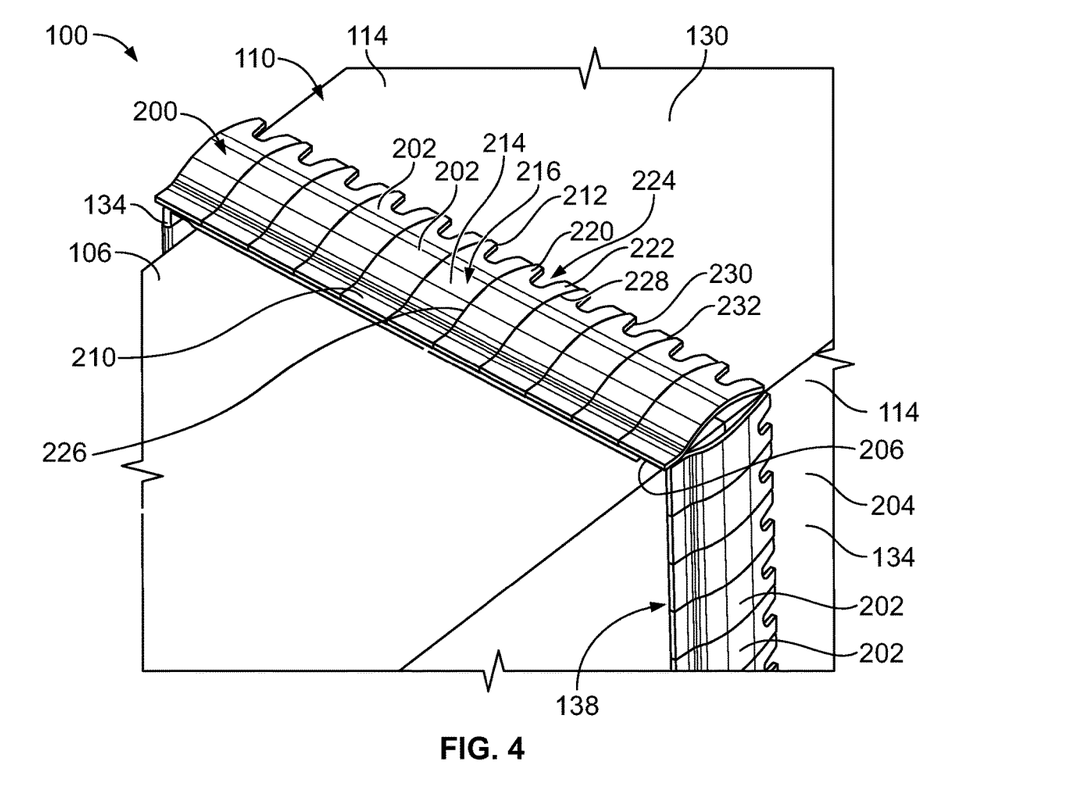
FIG. 4 is a front perspective view of a portion of the communication system showing the receptacle cage in accordance with an exemplary embodiment.

FIG. 4 is a front perspective view of a portion of the communication system 100 showing the receptacle cage 110 in accordance with an exemplary embodiment. The gasket 200 is provided at the front end 138. In various embodiments, the gasket 200 is integral with the receptacle cage 110. For example, the gasket 200 is stamped and formed with the cage walls 114 of the receptacle cage 110. In other various embodiments, the gasket 200 is separate and discrete from the receptacle cage 110 and coupled to the receptacle cage 110.

The gasket 200 includes a plurality of EMI springs 202 electrically connected to the cage walls 114 of the receptacle cage 110. The EMI springs 202 may extend along the top wall 130 and both side walls 134. In various embodiments, the EMI springs 202 may extend along the bottom wall 132. In various embodiments, the EMI springs 202 extend along exterior surfaces 204 of the cage walls 114, such as to engage the panel 144 (shown in FIG. 2). The EMI springs 202 may additionally or alternatively extend along interior surfaces 206 of the cage walls 114, such as to engage the pluggable module 106.

Each EMI spring 202 has a base 210 and a distal end 212 opposite the base 210 with a deflectable portion 214 between the base 210 and the distal end 212. The distal end 212 engages the corresponding cage wall 114. For example, the distal end 212 may press against the cage wall 114 at one or more points of contact. In an exemplary embodiment, the deflectable portion 214 is curved between the base 210 and the distal end 212 such that the deflectable portion 214 is elevated off of the cage wall 114. The deflectable portion 214 is spaced apart from the cage wall 114 and is deflectable toward the cage wall 114, such as when engaging the panel 144 or the pluggable module 106. The base 210 is provided at the corresponding cage wall 114. Optionally, the base 210 may be integral with the cage wall 114, such as being stamped and formed from the cage wall 114. Alternatively, the base 210 may be coupled to the cage wall 114, such as being clipped to the cage wall 114, welded to the cage wall 114, or otherwise mechanically and electrically connected to the cage wall 114. In such embodiments, the bases 210 may be held together, such as by a common carrier strip, that is coupled to the cage wall 114 or alternatively, the bases 210 may be separate and discrete from each other, such as with each base 210 being individually coupled to the cage wall 114 (for example, being welded to the cage wall 114).

The deflectable portion 214 includes a mating interface 216 configured to engage the panel 144 or the pluggable module 106. The mating interface 216 may be provided at or near an apex of the curve of the deflectable portion 214. In an exemplary embodiment, the base 210 is fixed relative to the cage wall 114 while the distal end 212 is movable relative to the cage wall 114. For example, when the deflectable portion 214 is compressed, the EMI spring 202 is flattened out causing the distal end 212 to move rearwardly relative to the base 210 along the cage wall 114. In an exemplary embodiment, the EMI spring 202 remains supported at the base 210 and the distal end 212 such that the deflectable portion 214 is spring loaded against the panel 144 (or the pluggable module 106) when engaged therewith.

In an exemplary embodiment, the distal end 212 is split having a first end beam 220 and a second end beam 222 at the distal end 212 separated by a slot 224. In the illustrated embodiment, the slot 224 is V-shaped; however, the slot 224 may have other shapes in alternative embodiments. The slot 224 may be approximately centered between a first side edge 226 and a second side edge 228 of the EMI spring 202. The slot 224 may extend along a length of the deflectable portion 214, such as part way between the distal end 212 and the mating interface 216. In the illustrated embodiment, the slot 224 extends approximately half of the length between the distal end 212 and the mating interface 216. The slot 224 may have other lengths in alternative embodiments.

The first end beam 220 is independently movable relative to the second end beam 222. The first end beam 220 defines a first point of contact 230 with the corresponding cage wall 114 and the second end beam 222 defines a second point of contact 232 with the corresponding cage wall 114. As such, each distal end 212 has multiple points of contact 230, 232 with the cage wall 114. The locations of the points of contact 230, 232 may be more precisely controlled compared to EMI springs that to not include the slot 224. For example, each of the end beams 220, 222 may be relatively narrow compared to an overall width of the EMI spring 202. The point of contact 230, 232 is contained within the width of the corresponding end beam 220, 222, and thus may be controlled by controlling the width of the end beam 220, 222. The width of the slot 224 may be selected to control the widths of the end beams 220, 222. Additionally, by centering the slot 224 along the distal end 212, the points of contact 230, 232 are positioned at or proximate to the first and second side edges 226, 228 of the EMI spring 202. As such, the points of contact 230, 232 are positioned in close proximity to adjacent EMI springs 202 to enhance effectiveness of the EMI shielding provided by the gasket 200.

In an exemplary embodiment, the EMI springs 202 are arranged side-by-side without a gap between adjacent EMI springs 202. The EMI springs 202 are separated or split from each other such that the EMI springs 202 are independently movable. In an exemplary embodiment, the first side edge 226 of each EMI spring 202 is positioned immediately adjacent the second side edge 228 of the adjacent EMI spring 202. The first side edge 226 may engage the second side edge 228 of the adjacent EMI spring 202. In an exemplary embodiment, a kerf is formed at a seam between the immediately adjacent EMI springs 202 when the EMI springs 202 are separated from each other by the cutting means used to separate the EMI springs 202. The kerf between the EMI springs 202 has a kerf width, defined by the width of the laser or jet or electron beam used to separate the EMI springs 202 without any additional gap or spacing formed or cut between the EMI springs 202. For example, the kerf is formed along a single cut line by the cutting means. The kerf width between adjacent EMI springs 202 is a very small spacing and the kerf width is the only spacing between the immediately adjacent EMI springs 202 (for example, the EMI springs 202 do not include an enlarged gap or spacing between the adjacent EMI springs 202). In an exemplary embodiment, the kerf width is less than a thickness of the material of the EMI springs 202. Optionally, the kerf width may be less than ½ a thickness of the material of the EMI springs 202. In various embodiments, the kerf width between the EMI springs 202 may be less than 0.30 mm for a metal sheet forming the EMI springs 202 having a material thickness of approximately 0.5 mm. In some various embodiments, the kerf width may be approximately 0.10 mm or less. In various embodiments, the cutting means used to separate the EMI springs 202 is a laser cutting means or a water jet cutting means or an electron beam cutting means. The laser or water jet or electron beam forms the first and second side edges 226, 228. The laser or water jet or electron beam forms the small kerf between the EMI springs 202. In other various embodiments, the EMI springs 202 are separated by shearing the EMI springs 202 from each other. Because the EMI springs 202 are positioned very close to each other, there is no gap for EMI leakage between the adjacent EMI springs 202. The shielding effectiveness of the gasket 202 is enhanced by having the EMI springs 202 immediately adjacent each other.

In the illustrated embodiment, the EMI springs 202 are arranged side-by-side immediately adjacent each other. The EMI springs 202 do not include a gap or large space between the adjacent EMI springs 202. For example, conventional gaskets include large gaps between EMI springs, such as gaps wider than a material thickness of the sheet metal used to form the gasket. In some conventional gaskets, the gaps may be approximately equal to a width of the EMI springs. However, the gasket 200 has a gapless configuration without additional spacing formed between the EMI springs 202 beyond the kerf formed from the separation process used to separate the EMI springs from each other. As used herein, "gapless" or "gapless configuration" refers to an EMI spring arrangement wherein the seam between the EMI springs is small, being less than half a material thickness of the EMI spring. The gapless configuration of the EMI springs 202 may extend along the entire length of the EMI springs 202 from the base 210 to the distal end 212. In other various embodiments, the gapless configuration of the EMI springs 202 is located forward of the mating interfaces 216, such as between the bases 210 and the mating interfaces 216. However, in some various embodiments, the gasket 200 may have gaps provided between the EMI springs 202 at the distal ends 212 rearward of the panel 144 without negatively impacting the effectiveness of the EMI shielding through the panel opening 146 because the forward end of such gasket 200 has a gapless configuration. In other various embodiments, the gapless configuration of the EMI springs 202 is located rearward of the mating interfaces 216, such as between the distal ends 212 and the mating interfaces 216. In such embodiments, gaps may be provided between the EMI springs 202 at the bases 210 forward of the panel 144 without negatively impacting the effectiveness of the EMI shielding through the panel opening 146 because the rearward end of such gasket 200 has a gapless configuration.

Figure 5:
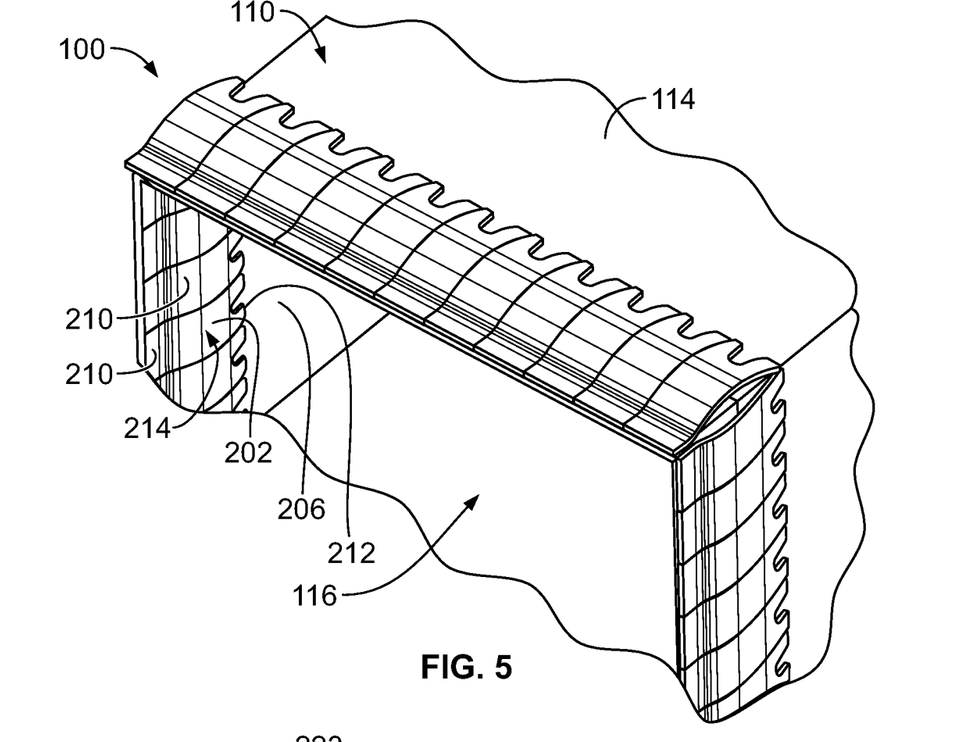
FIG. 5 is a front perspective view of a portion of the communication system showing the receptacle cage in accordance with an exemplary embodiment.

FIG. 5 is a front perspective view of a portion of the communication system 100 showing the receptacle cage 110 in accordance with an exemplary embodiment. FIG. 5 illustrates the EMI springs 202 extending along the interior surfaces 206 of the cage walls 114 to engage the pluggable module 106. The bases 210 are provided along the interior surfaces 206. The distal ends 212 are provided along the interior surfaces 206. The deflectable portion 214 is curved between the base 210 and the distal end 212 such that the deflectable portion 214 extends into the module channel 116, 118 to engage the pluggable module 106 (shown in FIG. 3).

Figure 6:
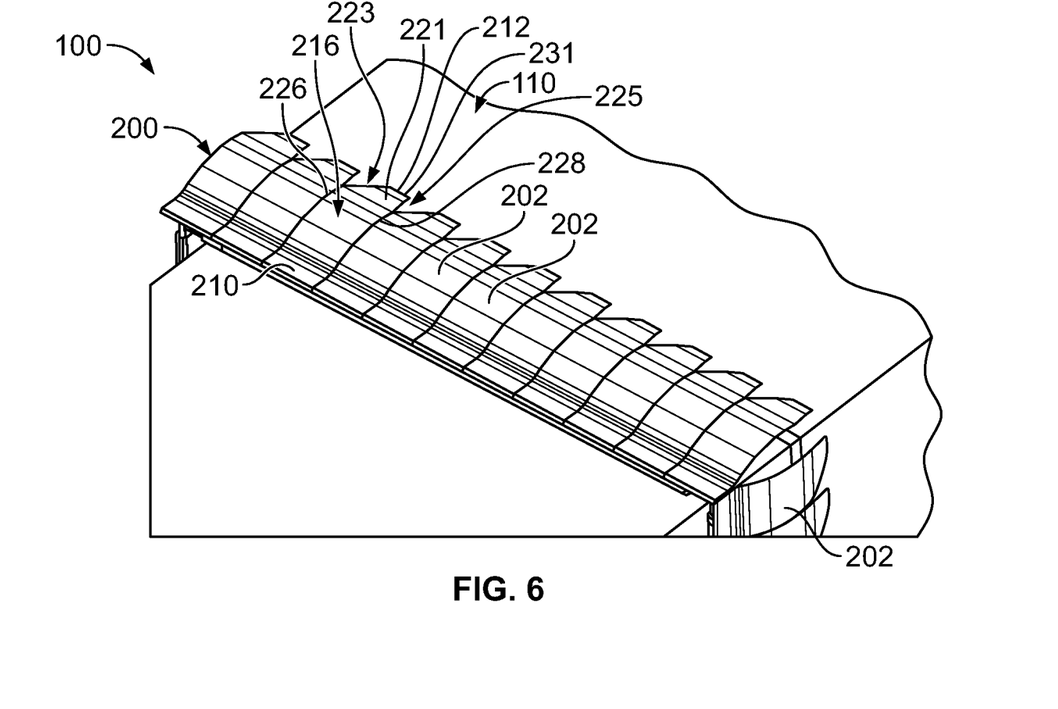
FIG. 6 is a front perspective view of a portion of the communication system showing the receptacle cage in accordance with an exemplary embodiment.

FIG. 6 is a front perspective view of a portion of the communication system 100 showing the receptacle cage 110 in accordance with an exemplary embodiment. Each EMI spring 202 of the gasket 200 has a convergent end at the distal end 212 in the illustrated embodiment rather than the split or forked, divergent distal end illustrated in FIG. 4. The distal end 212 has a central beam 221 with slots 223, 225 along the first and second side edges 226, 228. The central beam 221 locates a point of contact 231 of the distal end 212 of the EMI spring 202 generally along a central longitudinal axis of the EMI spring 202.

In an exemplary embodiment, the EMI springs 202 are arranged side-by-side without gaps between adjacent EMI springs 202, at least between the bases 210 and the mating interfaces 216. In the illustrated embodiment, the EMI springs 202 do not have any gaps therebetween until the area of the slots 223, 225, which is an area rearward of the mating interfaces 216. The EMI springs 202 are independently movable.

Figure 7:
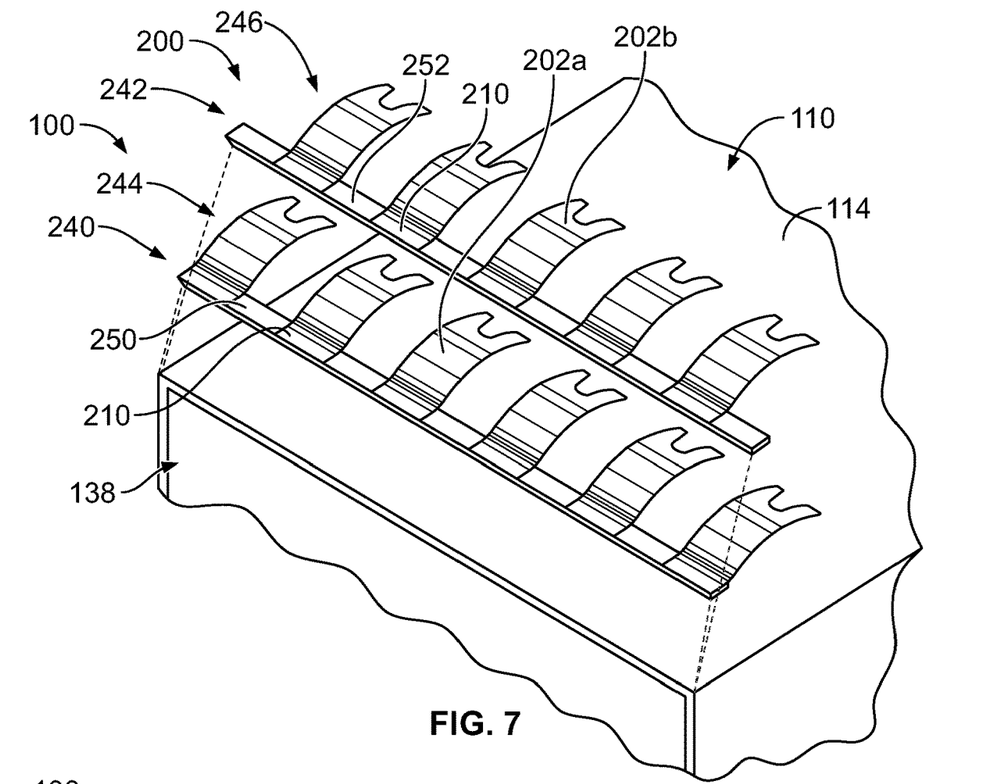
FIG. 7 is an exploded, front perspective view of a portion of the communication system showing the receptacle cage in accordance with an exemplary embodiment.

FIG. 7 is an exploded, front perspective view of a portion of the communication system 100 showing the receptacle cage 110 in accordance with an exemplary embodiment. In the illustrated embodiment, the gasket 200 is separate and discrete from the receptacle cage 110 and coupled to the receptacle cage 110. For example, the gasket 200 may be clipped to the front end 138 of the receptacle cage 110.

In an exemplary embodiment, the gasket 200 includes a first gasket member 240 and a second gasket member 242. The first gasket member 240 includes a first subset 244 of the EMI springs 202a and the second gasket member 242 includes a second subset 246 of the EMI springs 202b. The first and second EMI springs 202a, 202b are internested, such as in an alternating sequence, when the gasket 200 is assembled. For example, the first and second gasket members 240, 242 may be coupled together to internest the EMI springs 202a, 202b to form the gasket 200.

The first EMI springs 202a are carried by a first carrier strip 250. For example, the bases 210 extend from the first carrier strip 250. In an exemplary embodiment, the first EMI springs 202a are stamped and formed with the first carrier strip 250. The first EMI springs 202a are formed with gaps between the first EMI springs 202a; however, such gaps are sized and shaped to receive corresponding second EMI springs 202b such that the gasket 200 does not include gaps between the adjacent EMI springs 202a, 202b once assembled. The first carrier strip 250 may be coupled to the receptacle cage 110, such as to the corresponding cage wall(s) 114. For example, the first carrier strip 250 may be clipped onto the cage wall 114 and mechanically and electrically coupled to the cage wall 114 by an interference fit. In other various embodiments, the first carrier strip 250 may be welded to the cage wall 114 or coupled by other means or processes.

The second EMI springs 202b are carried by a second carrier strip 252. For example, the bases 210 extend from the second carrier strip 250. In an exemplary embodiment, the second EMI springs 202b are stamped and formed with the second carrier strip 252. The second EMI springs 202b are formed with gaps between the second EMI springs 202b; however, such gaps are sized and shaped to receive corresponding first EMI springs 202a such that the gasket 200 does not include gaps between the adjacent EMI springs 202a, 202b once assembled. The second carrier strip 252 may be coupled to the receptacle cage 110, such as to the corresponding cage wall(s) 114. For example, the second carrier strip 252 may be clipped onto the cage wall 114 and mechanically and electrically coupled to the cage wall 114 by an interference fit. In other various embodiments, the second carrier strip 252 may be welded to the cage wall 114 or coupled by other means or processes. In an exemplary embodiment, the first and second carrier strips 250, 252 may be coupled together, such as in a stack, when the gasket 200 is assembled. The carrier strips 250, 252 may be stacked top-to-bottom or front-to-rear depending on the particular application. The sizes and shapes of the first and second EMI springs 202a, 202b may be slightly different to accommodate stacking of the carrier strips 250, 252.

Figure 8:
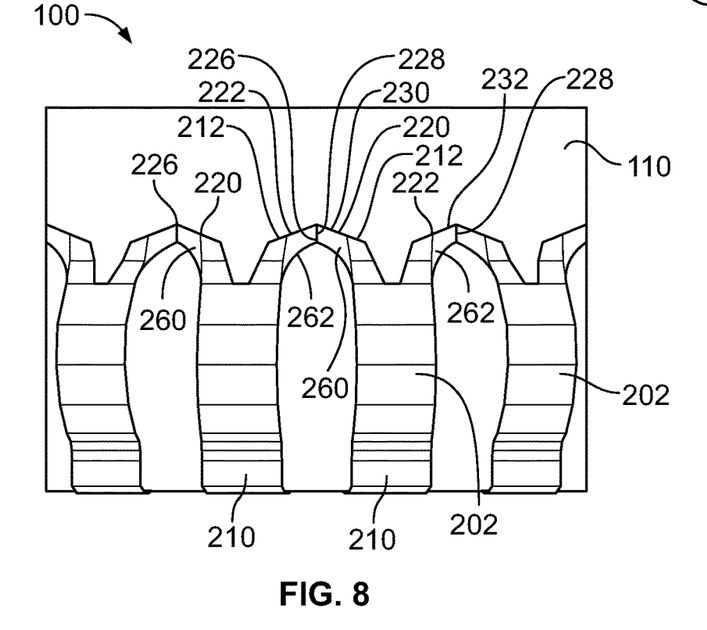
FIG. 8 is a front perspective view of a portion of the communication system showing the receptacle cage in accordance with an exemplary embodiment.

FIG. 8 is a front perspective view of a portion of the communication system 100 showing the receptacle cage 110 in accordance with an exemplary embodiment. The EMI springs 202 have flared ends at the first and second end beams 220, 222 at the distal ends 212 in the illustrated embodiment such that the distal ends 212 are arranged side-by-side without a gap between the adjacent EMI springs 202. While gaps are illustrated between the side edges 226, 228 along the bases 210, there are no gaps at the distal ends 212 between the end beams 220, 222 of adjacent EMI springs 202. The first side edge 226, at the first end beam 220, of each EMI spring 202 is positioned immediately adjacent the second side edge 228, at the second end beam 222, of the adjacent EMI spring 202. The first side edge 226 at the end beam 220 may engage the second side edge 228 at the end beam 222 of the adjacent EMI spring 202. Because the end beams 220, 222 are positioned very close to each other, there is no gap for EMI leakage between the adjacent EMI springs 202. The shielding effectiveness of the gasket 202 is enhanced by having the EMI springs 202 immediately adjacent each other at the end beams 220, 222.

In the illustrated embodiment, each EMI spring 202 includes a first foot 260 extending from the first end beam 220 and a second foot 262 extending from the second end beam 222. The first foot 260 is flared outward from the first end beam 220, such as toward the adjacent EMI spring 202. The first foot 260 may be flared perpendicular to the longitudinal axis of the EMI spring 202. In other various embodiments, the first foot 260 may be flared at another angle, such as extending at an angle oriented partially outward and partially rearward. The first foot 260 may define the point of contact 230 of the distal end 212. The second foot 262 is flared outward from the second end beam 222, such as toward the adjacent EMI spring 202. The second foot 262 may be flared perpendicular to the longitudinal axis of the EMI spring 202. In other various embodiments, the second foot 262 may be flared at another angle, such as extending at an angle oriented partially outward and partially rearward. The second foot 262 may define the point of contact 232 of the distal end 212.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "second," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A receptacle cage comprising:
cage walls including a top wall, a first side wall extending from the top wall, and a second side wall extending from the top wall opposite the first side wall, the top wall, the first side wall, and the second side wall forming a module channel configured to receive a pluggable module, the cage walls extending between a front end and a rear end of the receptacle cage, the module channel receiving the pluggable module at the front end; and
a gasket at the front end, the gasket having EMI springs electrically connected to the cage walls, each EMI spring having a base and a distal end opposite the base with a deflectable portion between the base and the distal end, the base provided at the corresponding cage wall, the distal end engaging the corresponding cage wall, the distal end being split with a first end beam and a second end beam at the distal end separated by a gap, the deflectable portion being spaced apart from the cage wall and being deflectable toward the cage wall, each EMI spring having a first side edge between the base and the distal end and a second side edge between the base and the distal end, wherein the first and second end beams are independently deflectable, the first end beam having a first point of contact with the corresponding cage wall, the second end beam having a second point of contact with the corresponding cage wall;
wherein the EMI springs are arranged side-by-side immediately adjacent each other.

2. The receptacle cage of claim 1, wherein the first side edge engages the second side edge of the adjacent EMI spring and the second side edge engages the first side edge of the adjacent EMI spring.

3. The receptacle cage of claim 1, wherein the EMI springs are split from each other and independently movable.

4. The receptacle cage of claim 1, wherein a kerf width between adjacent EMI springs is less than a thickness of the EMI springs.

5. The receptacle cage of claim 1, wherein the gasket is laser cut along a single cut line separating adjacent EMI springs.

6. The receptacle cage of claim 1, wherein the deflectable portion includes a panel interface configured to engage a panel, the EMI springs being arranged side-by-side immediately adjacent each other between the bases and the panel interfaces.

7. The receptacle cage of claim 1, wherein the deflectable portion includes a panel interface configured to engage a panel, the EMI springs being arranged side-by-side immediately adjacent each other between the distal ends and the panel interfaces.

8. A receptacle cage comprising:
cage walls including a top wall, a first side wall extending from the top wall, and a second side wall extending from the top wall opposite the first side wall, the top wall, the first side wall, and the second side wall forming a module channel configured to receive a pluggable module, the cage walls extending between a front end and a rear end of the receptacle cage, the module channel receiving the pluggable module at the front end; and
a gasket at the front end, the gasket having EMI springs electrically connected to the cage walls, each EMI spring having a base and a distal end opposite the base with a deflectable portion between the base and the distal end, the base provided at the corresponding cage wall, the distal end engaging the corresponding cage wall, the distal end being split with a first end beam and a second end beam at the distal end separated by a gap, the deflectable portion being spaced apart from the cage wall and being deflectable toward the cage wall, each EMI spring having a first side edge between the base and the distal end and a second side edge between the base and the distal end, wherein the gasket includes a first gasket member and a second gasket member, the first gasket member including a first subset of the EMI springs connected by a first carrier strip, the second gasket member includes a second subset of the EMI springs connected by a second carrier strip, the first and second gasket members being coupled together such that the first and second subsets of the EMI springs are internested.

9. The receptacle cage of claim 1, wherein the gap extends along the deflectable portion.

10. The receptacle cage of claim 1, wherein the first and second points of contact are offset from a center line of the EMI spring toward the first and second side edges, respectively.

11. The receptacle cage of claim 1, wherein the first point of contact is in close proximity to the second point of contact of the adjacent EMI spring and the second point of contact is in close proximity to the first point of contact of the adjacent EMI spring.

12. The receptacle cage of claim 1, wherein the first end beam includes a first foot flared outward away from the gap toward the adjacent EMI spring and the second end beam includes a second foot flared outward away from the gap toward the adjacent EMI spring.

13. The receptacle cage of claim 1, wherein the EMI spring extends along an exterior surface of the corresponding cage wall to engage a panel at a panel opening in the panel receiving the receptacle cage.

14. The receptacle cage of claim 1, wherein the EMI spring extends along an interior surface of the corresponding cage wall to engage the pluggable module.

15. A receptacle cage comprising:
cage walls including a top wall, a first side wall extending from the top wall, and a second side wall extending from the top wall opposite the first side wall, the top wall, the first side wall, and the second side wall forming a module channel configured to receive a pluggable module, the cage walls extending between a front end and a rear end of the receptacle cage, the module channel receiving the pluggable module at the front end; and
a gasket at the front end, the gasket having EMI springs electrically connected to the cage walls, each EMI spring having a base and a distal end opposite the base with a deflectable portion between the base and the distal end, the base provided at the corresponding cage wall, the distal end engaging the corresponding cage wall, the deflectable portion being spaced apart from the cage wall and being deflectable toward the cage wall, each EMI spring having a first side edge between the base and the distal end and a second side edge between the base and the distal end, the EMI springs being arranged side-by-side with first side edges facing second side edges of adjacent EMI springs immediately adjacent each other with the first side edge engaging the second side edge of the adjacent EMI spring and the second side edge engaging the first side edge of the adjacent EMI spring.

16. The receptacle cage of claim 15, wherein the distal end being split with a first end beam and a second end beam at the distal end separated by a gap.

17. The receptacle cage of claim 16, wherein the first and second end beams are independently deflectable, the first end beam having a first point of contact with the corresponding cage wall, the second end beam having a second point of contact with the corresponding cage wall.

18. The receptacle cage of claim 15, wherein the gasket includes a first gasket member and a second gasket member, the first gasket member including a first subset of the EMI springs connected by a first carrier strip, the second gasket member includes a second subset of the EMI springs connected by a second carrier strip, the first and second gasket members being coupled together such that the first and second subsets of the EMI springs are internested.

19. The receptacle cage of claim 1, wherein the gasket includes a first gasket member and a second gasket member, the first gasket member including a first subset of the EMI springs connected by a first carrier strip, the second gasket member includes a second subset of the EMI springs connected by a second carrier strip, the first and second gasket members being coupled together such that the first and second subsets of the EMI springs are internested.

* * * * *